United States Patent
Krech, Jr. et al.

(10) Patent No.: US 7,339,844 B2
(45) Date of Patent: Mar. 4, 2008

(54) MEMORY DEVICE FAIL SUMMARY DATA REDUCTION FOR IMPROVED REDUNDANCY ANALYSIS

(75) Inventors: Alan S. Krech, Jr., Ft. Collins, CO (US); Stephen D. Jordan, Ft. Collins, CO (US); John M. Freeseman, Ft Collins, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 147 days.

(21) Appl. No.: 11/357,871

(22) Filed: Feb. 17, 2006

(65) Prior Publication Data

US 2007/0195618 A1    Aug. 23, 2007

(51) Int. Cl.
    *G11C 29/00*     (2006.01)
(52) U.S. Cl. ..................... 365/200; 365/201; 365/210
(58) Field of Classification Search ............... 365/200, 365/201, 210, 189.02, 191, 241
    See application file for complete search history.

(56) References Cited

U.S. PATENT DOCUMENTS 6,667,918 B2 * 12/2003 Leader et al. ............... 365/201
7,055,074 B2 *  5/2006 Hughes et al. .............. 714/710

* cited by examiner

*Primary Examiner*—Richard T. Elms
*Assistant Examiner*—Dang Nguyen

(57) ABSTRACT

A method and apparatus for filtering failures due to must-repair rows or columns from a memory test fail summary image includes current available redundant row failure counts respectively associated with rows of a memory device and current available redundant column failure counts associated with columns of the device. Respective failure counts are preloaded with the respective values of redundant rows and columns available for repairing the device. When failures in memory cells of the device are encountered, either during test, or during scan of an earlier generated error image, the row and column failure counts associated with the rows and columns containing the memory cell failures are decremented. At the end of a test, the value of the failure counts indicates whether the corresponding row or column contain any failures at all, whether the corresponding row or column is designated as a "must-repair" row or column, and otherwise how many errors the corresponding row or column contain.

8 Claims, 4 Drawing Sheets

MEMORY DEVICE FAIL SUMMARY DATA REDUCTION FOR IMPROVED REDUNDANCY ANALYSIS

BACKGROUND OF THE INVENTION

Computers rely on random access memory to store program instructions and data. Computer memories are made up of memory cells, where each cell stores a single bit of data. Each computerized instruction and/or computerized element of data typically comprises a set of bits meaningfully organized into a simultaneously addressable collection of bits such as a byte (generally 8 bits), a word (generally a multiple of bytes), a block (generally a multiple of words), etc. The position of a bit within a given byte, word, block, etc. (hereinafter referred to collectively as "bytes") is meaningful in that meaning is given to bytes of data or instructions according to the values of the bits as positioned within the bytes according to a predefined ordered format.

Bytes and words are therefore typically addressed as a single entity using an address bus, a data bus, and memory cell enablement circuitry. More particularly, an address is placed on the address bus, cells of the memory device are enabled by activating write or read enable lines corresponding to the addressed cells, and data is either written to the cells or read from the cells addressed by the address bus, depending on whether the operation is a write operation or a read operation.

To keep up with the demand for faster and more capable systems, modern memory devices such as random access memories (or RAMs), Static RAMs (SRAMs), etc., are very dense. Because of their density, and the limitations of the manufacturing process, semiconductor memory devices will often contain one or more defective memory cells immediately after manufacture.

During the manufacturing and testing of a memory device, memory testing is performed in which all of the memory cells of the memory device are tested. Typical tests include sequentially incrementing or decrementing memory addresses while writing 0's and 1's into the memory cells. It is customary to refer to a collection of 1's and 0's being simultaneously written to or read from during a memory cycle as a "vector", while the term "pattern" refers to a sequence of vectors. It is conventional for tests to include writing patterns into the memory space such as checkerboards, walking 1's and butterfly patterns.

As mentioned previously, individual memory cells may fail during test. To improve the yield of these devices, manufacturers typically incorporate redundant memory cell groups such as redundant rows and/or redundant columns of cells. It is often possible to substitute the redundant memory cell groups in place of corresponding memory cell groups in the memory device that contain one or more defective memory cells, thereby yielding a fully functional memory device. The redundant memory cell groups may be mapped into the memory device to replace memory cell groups in the memory device that have one or more memory cell failures. The process of identifying defective memory cell groups that contain failing memory cells and mapping redundant memory cell groups to corresponding defective memory cell groups in the memory device is called "redundancy analysis".

Typically, a single given memory cell is a member of multiple different memory cell groups and therefore may be repaired using one of multiple different available redundant memory cell groups. For example, the memory device may be organized into rows and columns, allowing for memory cell groups that comprise rows and memory cell groups that comprise columns. The memory device may provide a number of redundant rows and a number of redundant columns that may be mapped to replace various rows and columns in the memory device. In this example, there may be available both a redundant row and a redundant column, either of which could be used to repair the given cell. If there are multiple failures along the same row, then it is better to use a single redundant row to repair the multiple memory cell failures rather than to use several redundant columns since it would be more efficient and only a limited number of redundant memory rows and columns are available. Suppose, for instance, that there are only four redundant columns and four redundant rows available to repair defective memory cells in a given memory device. In this example, if there is a row that has failures at three different columns, that row can be repaired either by using three of the redundant columns, or by using just one of the redundant rows. If, however, there is a row that has failures at five different columns, then that row can only be repaired by making use of one of the redundant rows since there are not enough redundant columns available to repair all of the failures in this row. A row that can only be repaired using one of the available redundant rows is considered a "must repair" row. Similarly, a column that can only be repaired using one of the available redundant columns is considered a "must repair" column.

It is known that once a given row or column has been identified as a "must repair" row or column, respectively, due to detection of a minimum number of memory cell failures in that row or column, all of the memory cell failures in the given row or column will be repaired by an available redundant row or column, respectively, so that it is unnecessary to further test or analyze any remaining untested memory cells in the given row or column of the memory device for failures.

How repair of defective memory cells using redundant memory cell groups is actually achieved on the circuit level is well understood by those who manufacture such devices, so it is sufficient for those skilled in the art to simply say that incorporated into those devices are some number of selectably destroyable elements whose destruction enables gating that in turn alters the internal logic of an associated circuit. This ability is used to route internal signals to replacement circuits that substitute for defective ones.

Ideally, a memory tester should be able to identify a need for repair in the memory device under test, the location of the required repairs, and the type of repairs needed, and then must be able to perform the appropriate repairs.

In certain memory testers, hardware may be designed to capture an entire bitmap, herein referred to as an error image, of the device contents. The error image is addressed by the same address as, or by an address derived from, the address that is applied to the memory device under test. During a test, when the contents of a memory cell in the memory device matches or fails to match expected results, a corresponding bit at that address in the error image is either set or cleared, according to the convention in use. For example, a zero ("0") may be used to represent a failure to match and a one ("1") may be used to represent a match. The error image may be analyzed to find the errors and the optimum solution. This strategy significantly reduces the complexity of the analysis task, as well as reducing test time.

Often, multiple "tag" images are generated during the testing of the memory device. The tag images map memory cell failures detected in the memory device over a single dimension. In the example above, one tag may contain a map of failing rows, and another may contain a map of failing columns. Within the row tag, one location may contain a flag indicating whether there were any errors in any of the memory cells in the corresponding row of the memory device. Similarly, within the column tag, one location may contain a flag indicating whether there were any errors in any of the memory cells in the corresponding column of the memory device. Because in the tag images a single memory location (typically only a bit in size) is used to represent an entire row or column of the memory device, a tag image is substantially smaller than the a full error image, which makes it possible to quickly identify which memory cell groups (in the above example, which rows and columns) have failures. The tag images thus operate to store an indexed collection of detected events for later inspection.

FIG. 1 is a block diagram of a conventional system for testing a memory device. A memory tester 4 applies a series of test vectors 3 to a memory device under test (DUT) 2 to detect failures in any of the memory cells of the memory DUT 2. The DUT 2 includes an array of memory cells 2a arranged in memory cell groups of rows ([0 . . . X−1]) and memory cell groups of columns ([0 . . . Y−1]). Traditionally, an error image 6 of the same size (row, column) as, and addressable in the same way as, the memory device under test (DUT) 2 is provided to store a bit corresponding to each memory cell of the memory DUT 2. Conventionally, a value of 0 in a bit cell of the error image 6 indicates that a failure occurred during testing of the corresponding bit cell 2a in the memory DUT 2, while a 1 indicates that no failure was detected in the corresponding bit cell 2a in the memory DUT 2. Of course, other conventions may be used to indicate the pass or fail of corresponding bit cells in the memory DUT 2.

A set of redundant memory cell groups of rows 8 ([0 . . . M−1]) and a set redundant memory cell groups of columns 10 ([0 . . . N−1]) may be implemented for use in repairing failures detected in memory cells 2a of the DUT 2 addressed by corresponding row and column addresses.

Traditionally, row and column tag images 14, 12 implement a single bit per address in the corresponding row or column direction to indicate the existence of at least one failure somewhere along the corresponding row or column of the DUT 2. Tag images may assist in performing analysis of the error image to determine how to repair any detected failures in the memory DUT.

As an illustrative example, consider that an address applied to the DUT 2 might be separable into row and column dimensions with corresponding row X and column Y address components that relate to the internal organization of the memory DUT 2. The memory DUT 2 is therefore addressable in two dimensions and the address applied to the DUT 2 has the X and Y address components embedded therein, but perhaps not in an obvious or convenient way. Suitable gating circuits can extract, for example, the Y address component and apply it as an address to a column tag image 12, which allows storage of information that is indexed according to the Y address. Similarly, gating circuits can extract the X address component and apply it as an address to a row tag image 14, which allows storage of information that is indexed according to the X address. Traditionally, the information stored in each entry of the row and column tag images is a single bit whose end-of-test meaning is that a failure did or did not occur at least once in the DUT 2 along the corresponding respective X addressed row or Y addressed column. By generating tag images for both row X and column Y address components, a test analyzer can obtain useful information about the failures in a memory DUT whose internal organization includes the notions of row X and column Y addresses. The use of tag images 12, 14 may realize a significant reduction in tester memory requirements as the needed tag image storage requirements consist of a number of locations equal to only the sum of the X and Y address spaces, rather than equal to their product, which is what a conventional error image would have to have.

A common failure mechanism of memory devices reduces the effectiveness of conventional tag images. Many times devices have a stuck group of memory cells in which many or all addresses within that particular memory cell group are defective. For example, in the memory DUT 2 of FIG. 1, testing may reveal that the DUT 2 has a stuck row or a stuck column in which many or all addresses within that particular stuck row or a stuck column are defective. A single redundant memory cell group may repair the stuck memory cell group in the memory device. However, in devices that are organized in memory cell groups in multiple dimensions so that a given address applied to the memory device includes multiple dimensional address components embedded therein, the tag images may be rendered ineffective for purposes of redundancy analysis, as best understood from the following example. Again referring to DUT 2 of FIG. 1, which is organized into memory cell groups (rows 0 . . . X−1 and columns 0 . . . Y−1) in two dimensions (a row dimension and a column dimension), a single redundant row may repair a stuck row in the DUT 2. However, the column tag 12 may indicate a failure in all Y addresses due to the failures in all memory cells of the stuck row of the DUT 2. If the memory DUT 2 has both a stuck row and a stuck column, then both tag images 12 and 14 may indicate complete failures in all addresses, whereas in actuality it may be merely that all X addresses within a single column and all Y addresses within a single row are defective. In devices that have stuck row or stuck column failures, the usefulness of the tag images may therefore be limited or even rendered completely ineffective insofar as extracting information concerning rows and/or columns containing only sparse failures.

Accordingly, there exists a need in the art for a technique for improving and streamlining redundancy analysis in memory test and thus to reduce the test time and hardware needed for testing of memories. There also exists a need to improve the effectiveness and usability of tag images in memory devices having stuck rows and/or stuck columns.

SUMMARY OF THE INVENTION

In one embodiment, a memory device having a plurality of memory cells organized into a plurality of memory cell groups along a plurality of dimensions, wherein each memory cell group is addressable by one of a plurality of address components corresponding to one of the plurality of dimensions is tested by a method comprising the steps of selecting a memory device address to select a plurality of memory cell groups in the memory device that are addressed by the selected memory address along different respective dimensions, the memory device address comprising address components corresponding to each of the plurality of the different respective dimensions, applying a test vector to the memory device at the selected memory device address, reading contents from the memory device at the selected memory device address, comparing the test vector with the contents, and if a mismatch exists between the test vector and the contents, failure counting the mismatch as a failure and associating the failure counted failure with each of the selected memory cell groups.

In one embodiment, a memory device having a plurality of memory cells organized into a plurality of memory cell groups along a plurality of dimensions, wherein each memory cell group is addressable by one of a plurality of address components corresponding to one of the plurality of dimensions is tested by a method comprising the steps of selecting a memory device address to select a plurality of memory cell groups in the memory device that are addressed by the selected memory address along different respective dimensions, the memory device address comprising address components corresponding to each of the plurality of the different respective dimensions, applying a test vector to the memory device at the selected memory device address, reading contents from the memory device at the selected memory device address, comparing the test vector with the contents, and if a mismatch exists between the test vector and the contents, and if none of the selected memory cell groups contain a maximum number of failures associated with the respective dimensions of the respective selected memory cell groups, failure counting the mismatch as a failure and associating the failure counted failure with each of the selected memory cell groups and adding the selected memory address to a list of failed addresses.

In one embodiment, an apparatus for keeping track of failures in a memory device comprising a plurality of memory cells organized into a plurality of memory cell groups along a plurality of dimensions wherein each memory cell group is addressable by one of a plurality of address components corresponding to one of the plurality of dimensions, comprises a plurality of failure counts each respectively associated with a respective memory cell group of the memory device, a test vector generator which generates a test vector, an address generator which generates a selected memory device address, a test function which applies the test vector to the memory device at the selected address, and a count manager which compares the applied test vector with the contents and adjust the respective failure counts associated with each of the memory cell groups selected by the selected address if a mismatch exists between the test vector and the contents.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

In the following detailed description of the embodiments, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural logical and electrical changes may be made without departing from the spirit and scope of the present inventions. The following detailed description is, therefore, not to be taken in a limiting sense, and the scope of the present inventions is defined only by the appended claims.

Embodiments of the invention improve the usefulness of information extractable from a tag image for use in redundancy analysis of a memory device comprising a plurality of memory cells organized into a plurality of memory cell groups along a plurality of dimensions, wherein each memory cell group is addressable by one of a plurality of address components corresponding to one of the plurality of dimensions. Tag images may be generated for each of the plurality of dimensions, each tag image comprising a failure count associated with each of the plurality of memory cell groups in a given dimension of the memory device. Each failure count in each dimension stores an indication of the number of failures detected in the memory cell group associated with the failure count. Failure counts have associated with them the notion of becoming "expired", meaning that the number of failures in a given memory cell group associated with the particular failure count has reached or exceeded a predetermined maximum number of failures. In one embodiment, the predetermined maximum number of failures is based on the number of available redundant memory cell groups organized along a given dimension other than the dimension of the given memory cell group that are available for repair of the memory cell group. Thus, a failure count expires when there is an insufficient number of redundant memory cell groups in the other dimension available to repair the associated memory cell group. A memory cell group associated with an expired failure count must be repaired by a redundant memory cell group organized along the same dimension as the memory cell group associated with the expired failure count. Keeping track of the expiration of a failure count may be accomplished in various ways, including but not limited to counting up or down a maximum number of allowed failures (which may coincide with the number of available redundant memory cell groups in another dimension that may be used to repair a memory cell group in the first dimension) associated with the memory cell group until the failure count reaches a predetermined expiration value, or maintaining a flag indicating expiration of or non-expiration of the associated failure count.

Figure 1:
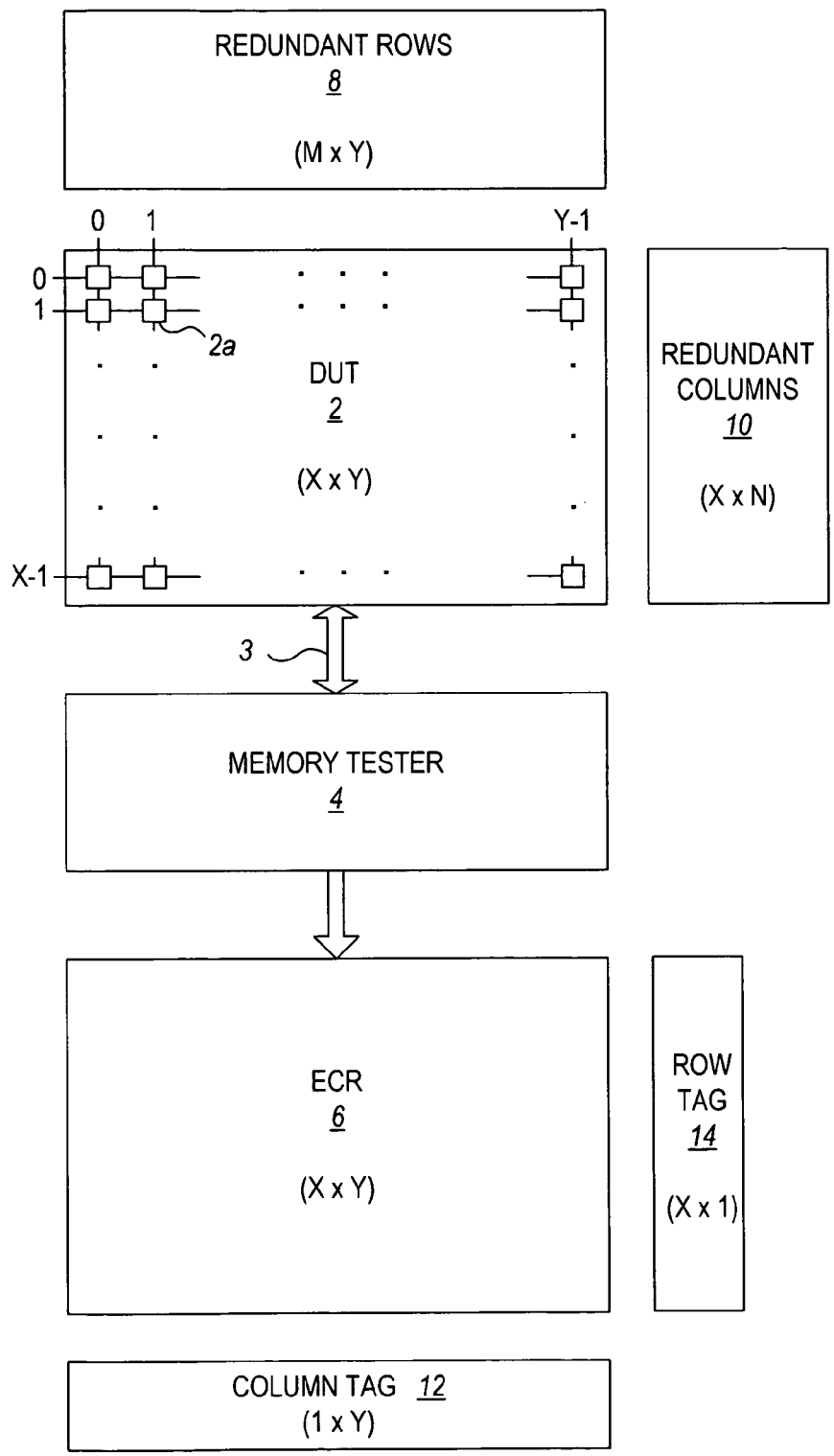
FIG. 1 is a block diagram of a conventional system for testing a memory device.
Figure 2:
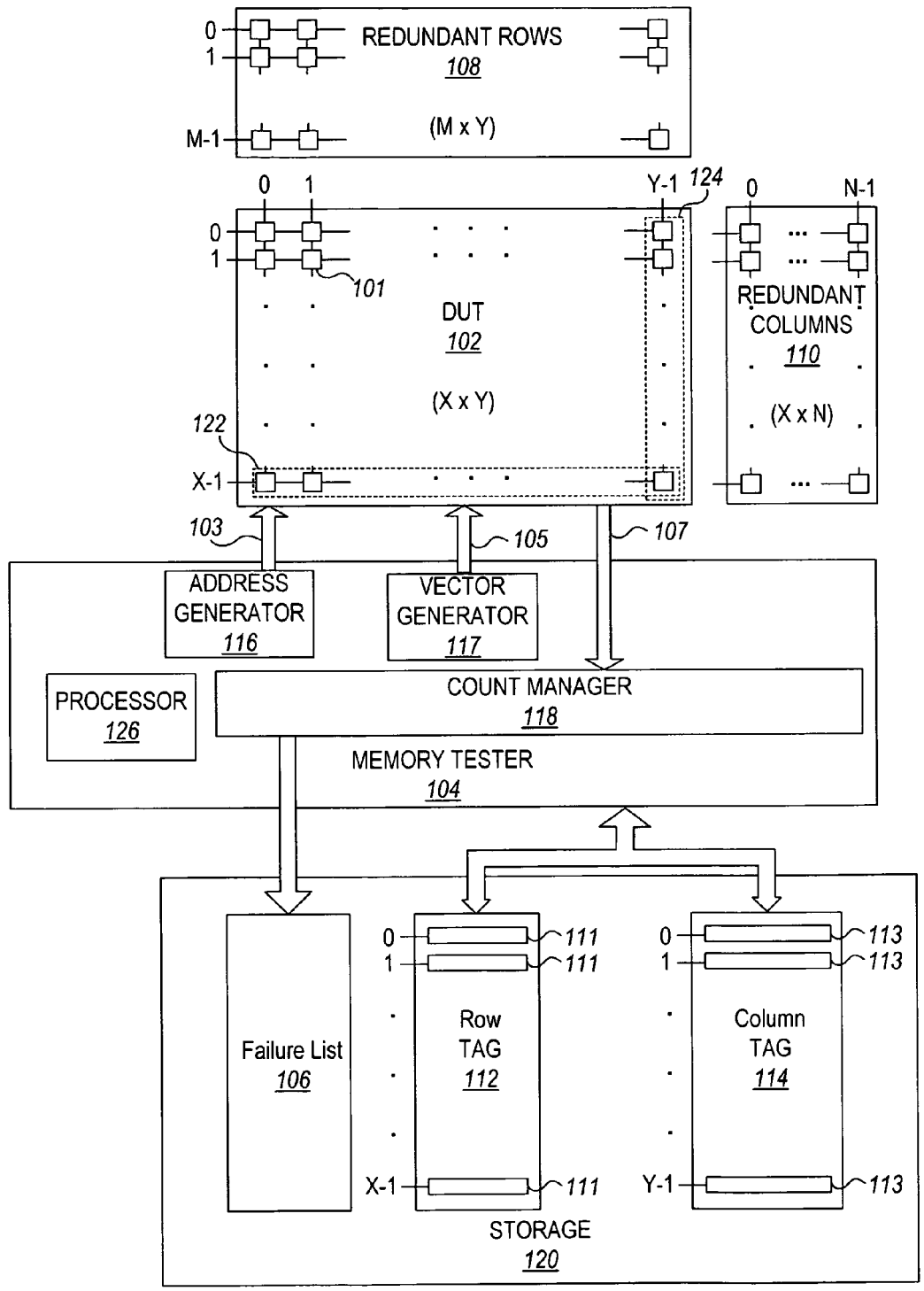
FIG. 2 is a block diagram of an exemplary system for testing a memory device implemented in accordance with the invention.

FIG. 2 is a functional block diagram of one embodiment of a system for testing a memory device. The system includes a memory tester 104 and computer storage 120. The memory tester 104 comprises processing means for coordinating functions of an address generator 116, a vector generator 117, and a count manager 118, discussed hereinafter. The processing means may include one or more processors 126 that execute computer instructions that implement the functions and coordination of the functions of any and all of the address generator 116, vector generator 117, and count manager 118, or may comprise independent processors for each or any of the functional components 116, 117, 118. The address generator 116, the vector generator 117, and the count manager 118, and the coordination function of the memory tester 104 may be implemented in software and/or hardware.

The computer storage 120 may include any media in which computer instructions are stored, including but not limited to run-time media such as random access memory (RAM) or read-only memory (ROM) and distribution media such as floppy disks, CD-ROMs, DVDs, data storage tapes, and hard disks.

A memory device under test (DUT) 102 includes memory cells 101 that are arranged in multiple dimensions having independent address components. The memory DUT 102 shown in FIG. 2 is organized such that a given applied address includes address components corresponding to a row dimension and a column dimension. Each dimension includes a number of memory cell groups. Thus, the row dimension includes a number (X) of rows [0 . . . X−1] and the column dimension includes a number (Y) of columns [0 . . . Y−1]. Each memory cell group includes a number of memory cells 101 that are simultaneously addressable by a common address component corresponding to the dimension. For example, a row 122 addressed by row address component [X−1] is shown circumscribed by a dashed line to illustrate a single row memory cell group organized in the row dimension. Similarly, a column 124 addressed by column address component [Y−1] is shown circumscribed by a dashed line to illustrate a single row memory cell group organized in the column dimension. Each memory cell 101 stores a single bit of data. The selected memory cell(s) are cells 101 whose row and column address components match those of the applied address 103.

An address 103 applied to the memory device 102 may be separable into the dimensional address components (i.e., row address (x) and column address (y) components) that relate to the internal organization of the bit cells 101 of the memory device 102. The address applied to the memory device 102 has the row and column addresses of the grouped memory cells embedded therein.

The memory device 102 is provided with a number of redundant memory cell groups in each of the row dimension and the column dimension. Thus, a number (M) of redundant rows 108 [0 . . . M−1] and a number (N) of redundant columns 110 [0 . . . N−1] may be implemented for use in repairing memory cell failures detected in the device 102.

Tag images 112 and 114 for each of the row dimension and the column dimension may be generated. These tag images 112, 114 differ from traditional row and column tag images in that instead of implementing a single bit per corresponding row or column, respectively, to indicate any number of memory cell failures in the corresponding row or column of the device, each addressable tag image entry (RowTag[x], where x=0 . . . X−1, and ColTag[y], where y=0 . . . Y−1) comprises at least a failure count for storing the number of detected failures in the corresponding row or column of the device (or a number from which the number of detected failures may be derived) and a mechanism for indicating the expiration of or non-expiration of the associated failure count.

Each failure count associated with a memory cell group stores a failure count that reflects (directly or indirectly) the number of failures detected in the corresponding memory cell group (up to a maximum allowed number, described hereinafter). The failure count may be implemented according to many different embodiments. In one embodiment, the failure count of a given memory cell group organized along a give first dimension is preloaded with a maximum number of available redundant components in a second dimension other than the first dimension of the given memory cell group. The failure count is then decremented each time a failure is detected in any of the cells in its associated memory cell group (subject to certain qualifications, discussed hereinafter). The actual number of failures in a given memory cell group may be derived from its failure count value by subtracting the final failure count value from the preloaded failure count value (for example, the maximum allowed failures or number of available redundant memory cell groups in the second dimension).

In one embodiment, the failure count is initialized to a predetermined low value and incremented each time a failure is detected in any of the cells in the addressed memory cell group associated with the failure count (subject to certain qualifications, discussed hereinafter). If the predetermined low value is zero, then the failure count value represents directly the actual number of failures detected in the associated memory cell group. If the predetermined low value is other than zero, then the actual number of failures in the associated memory cell group may be derived from the failure count value by subtracting the predetermined low value from the failure count value. Thus, the value indirectly represents the number of failures. Other failure counting schemes may also be used to keep track of the failure count the number of failures detected in the memory cell group.

Any given failure count may become "expired" if the number of detected failures in the memory cell group associated with the particular failure count has reached or exceeded a predetermined maximum number of failures. In one embodiment, the mechanism for indicating the expiration of or non-expiration of the associated failure count is by associating one or more values of the failure count with the meaning "expired" and by associating values that are not associated with the meaning "expired" to the meaning of "non-expired". For example, in one embodiment where a failure count is preloaded with a maximum number of available redundant components in a dimension other than the dimension of the memory cell group associated with the failure count, and the failure count is decremented each time a failure is detected in any of the cells in the addressed memory cell group associated with the failure count (subject to certain qualifications, discussed hereinafter), expiration of the failure count may be indicated by the failure count reaching a value of zero (or less). In this embodiment, non-expiration of the failure count is indicated by a positive value of the failure count. In another embodiment, where the failure count is initialized to a predetermined low value that is incremented each time a failure is detected in any of the cells in the addressed memory cell group associated with the failure count, expiration of the failure count may be indicated by the failure count reaching a predetermined high value such that the difference between the predetermined high value and the preloaded value of the failure count is equal to (or greater than) a predetermined maximum allocated redundant memory cell groups allocated to the particular dimension of the memory cell group associated with the failure count. In another embodiment, a flag or other type of field may be maintained indicating expiration or non-expiration of the associated failure count.

Referring still to FIG. 2, an address generator 116 generates memory addresses 103 and a test vector generator 117 generates test vectors 105. The memory tester 104 coordinates the application of a test vector 105 generated by the test vector generator 117 to the memory device under test 102 at a selected memory address 103 generated by the address generator 116. The memory tester 104 coordinates reading back contents 107 of the memory device 102 from the selected memory address 103. The contents 107 read back from the memory device 102 are compared to the applied test vector 105. If a mismatch exists between the contents 107 read back from the memory device 102 and the applied test vector 105, a failure exists on one or more of the memory cells 101 addressed by the selected memory address 103. A count manager 118 makes a determination as to the expiration status of the failure counts 111, 113 associated with the respective selected row and column, and if none of the failure counts 111, 113 are expired, adjusts the associated failure counts 111, 113 to reflect the additional failure and adds the selected memory address to a failure list 106.

In one embodiment, each failure count entry 111 of the row tag image 112 is preloaded with a predetermined maximum number of available redundant columns and each failure count entry 113 of the column tag image 114 is preloaded with a predetermined maximum number of available redundant rows. The predetermined maximum number of available redundant rows may be the number of redundant rows, M, and the predetermined maximum number of available redundant columns may be the number of redundant columns, N. For example, if the device 102 is provided with eight redundant rows (i.e., M=8) and thirty-two redundant columns (i.e., N=32), then each failure count entry 111 in the available redundant row image 112 may be preloaded with the number 32, and each failure count entry 113 in the available redundant column image 114 may be preloaded with the number 8. The predetermined maximum number of available redundant rows and columns may be less than the number (M, N) provided, however, if one or more redundant rows and/or columns are reserved for alternate purposes.

Figure 3:
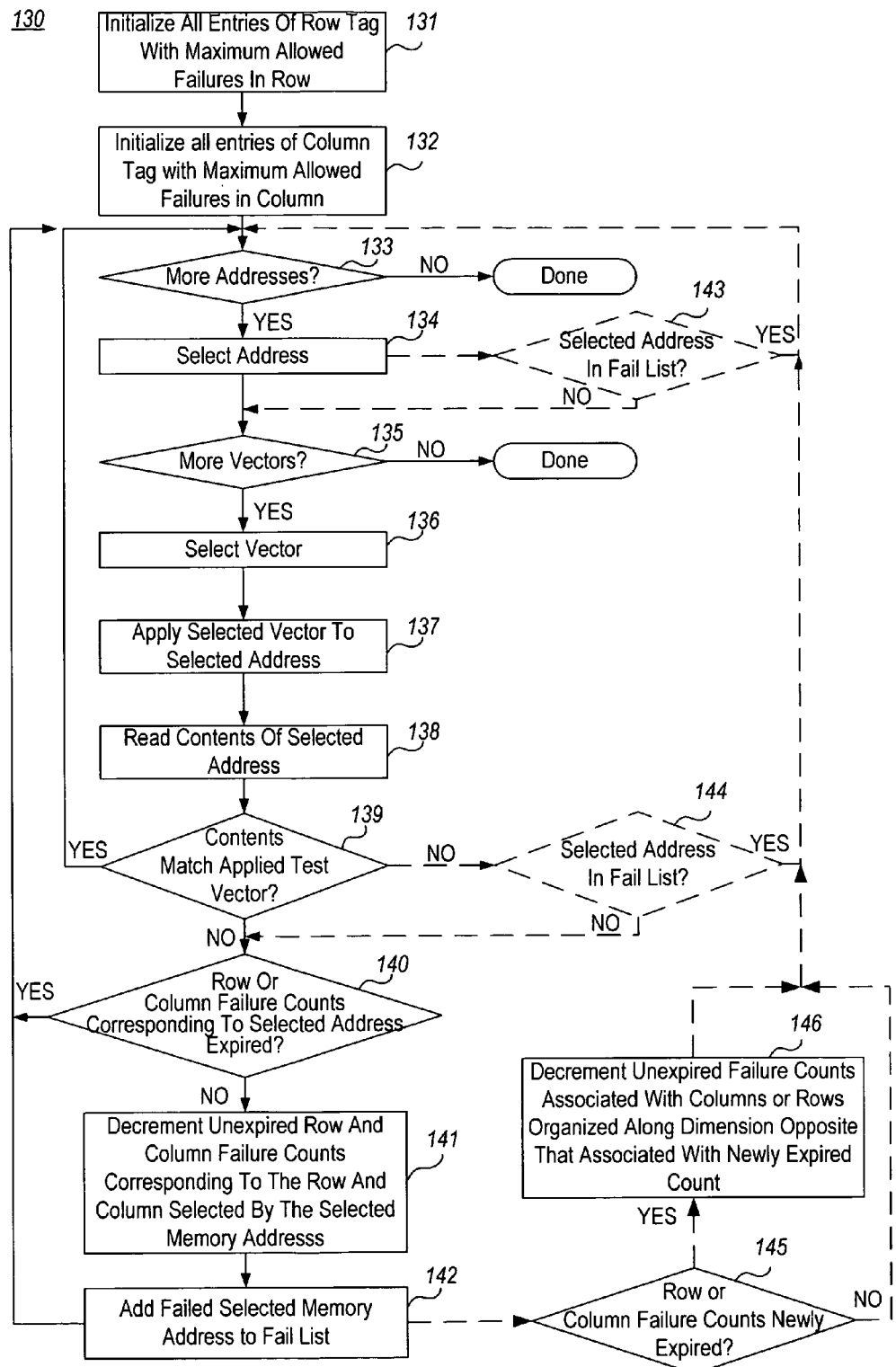
FIG. 3 is a flowchart of an exemplary method for testing a memory device.

FIG. 3 is a high-level flowchart illustrating an exemplary embodiment of a method 130 for testing the memory device 102 of FIG. 2. At the beginning of the test, all failure counts 111 (stored in corresponding rows of the row tag image 112) are initialized with a failure count value representing the maximum number of allowed failures along a row such that the row is not designated a "must-repair" row (step 131). In one embodiment, this number is equal to the number of redundant columns available for repair of the memory device. Likewise, all failure counts 113 (stored in corresponding rows of the column tag image 114) are initialized with a failure count value representing the maximum number of allowed failures along a column such that the column is not designated a "must-repair" column (step 132). In one embodiment, this number is equal to the number of redundant rows available for repair of the memory device. A test vector 105 and memory device address 103 are selected (steps 133 through 136). The test vector 105 is applied to the memory device 102 at the selected address 103 (step 137). The contents 107 of the memory cells 101 of the device 102 at the selected address 103 are read back (step 138) and compared to the applied test vector (step 139).

If the contents 107 match the applied test vector 105, then each of the memory cells 101 selected by the selected memory address is considered good (or "non-defective") for that particular test vector, and testing of the memory device 102 at additional addresses and/or with additional test vectors may be continued.

If the contents 107 do not match the applied test vector 105 (determined in step 139), however, and if the row and column failure counts 111 and 113 corresponding to the row and column selected by the selected memory address 103 are not expired (e.g., have not counted down to zero (or less)) (determined in step 140), then both of the row failure count 111 and column failure count 113 corresponding to the selected memory address 103 are decremented in order to "count" the failure on the corresponding selected row and column (step 141). The selected memory address is added to a list of failed addresses (step 142) for later analysis of an optimum repair solution. Testing of the memory device 102 at additional addresses and/or with additional test vectors may be continued.

It will be noted that inherent in the logic of the algorithm is that if either or both of the failure counts 111, 113 associated with the selected row and column of the memory device 102 are expired (in this case, where the failure count(s) are zero or less), then the failed cell(s) lie in a corresponding known must-repair row and/or known must-repair column (determined by the expired count). Since a must-repair row or column repairs all cells in the corresponding row or column of the device, additional failure information on a must repair row or column is considered redundant. Therefore, once a row or column has been identified as being a must-repair row or column, additional failures detected in that row or column by application of test vectors to additional selected addresses are not recorded in the failure list 106.

It will be noted that once a given row or column has been designated as a "must-repair" row or column, as indicated by the expiration of a failure count associated with the given row or column, then there exists one fewer available redundant rows or columns with which to repair any remaining failures in the memory device. Accordingly, in one embodiment, if decrementing a given failure count associated with a row or a column (in step 141) results in expiration of the given failure count such that the corresponding row or column must be repaired by a redundant row or column of the same type (determined in step 145), then the unexpired failure counts associated with columns or rows (memory cell groups organized along the opposite dimension) are also decremented (in step 146) to reflect the fact that there is one less available redundant row or column with which to repair the memory. For example, suppose that the memory device is configured with two redundant rows and four redundant columns. Suppose further that all failure counts associated with rows are initialized with a failure count of "4", allowing up to 4 failures (repairable by the 4 available redundant columns) before designating a given row as a "must-repair" row, and all failure counts associated with columns are initialized with a failure count of "2", allowing up to 2 failures (repairable by the 2 available redundant rows) before designating a given column as a "must-repair" column. Further suppose that, after several iterations of applying test vectors and reading back the contents from the memory, one of the rows in the memory device is designated as "must-repair" (due to it's associated failure counter expiring). In this case, one of the two redundant rows must be used to repair that "must-repair" row. Thus, there is really only one remaining available redundant row left with which to repair failures. In the present example, then, because the failure counts associated with the column memory cell groups reflect the number of redundant rows available to repair the column, all unexpired failure counts associated with columns are decremented to reflect the fact that the number of remaining unallocated redundant rows has been decreased by one through the allocation of one of the redundant rows to the designated must-repair row. (Note that in FIG. 2, the failure counts 111 associated with rows of the memory device are stored as row-addressed entries in the Row Tag 112, and each failure count 111 is pre-loaded with the number of available redundant columns. Similarly, the failure counts 113 associated with columns of the memory device are stored as column-addressed entries in the Column Tag 114, and each failure count 113 is pre-loaded with the number of available redundant rows. Thus, in the present example, the failure counts 113 in the Column Tag 114 get decremented since there is one fewer row available to repair column failures).

Continuing with the above example, if during further iteration there is a column that has errors at two or more different rows (other than the "must-repair" row just discussed), then that column can only be repaired using one of the remaining redundant columns since the number of remaining available redundant rows has been decreased by one and consequently there are not enough remaining available redundant rows to repair the failures in that column using redundant rows.

As illustrated by these examples, as rows or columns get allocated to must-repair elements, the number of available rows or columns decreases. Thus, the failure counts may be updated as in step 146 to reflect the decreasing supply of unallocated redundant memory cell groups.

It will further be noted that if the memory test applies multiple test vectors to any of the memory device addresses, then once a failure has been identified by the application of any test vector at a given address, further failures identified on that address should be ignored. Accordingly, at some point prior to updating failure counts and adding the address to the fail list, a check is preferably made (e.g., at steps 143 or 144), to determine whether a currently selected address has been identified previously as having a failure, for example by determining whether the currently selected address already appears in the fail list. If the currently selected address has been previously identified as having a failure, then the failure counts associated with that address are preferably not updated and processing continues with additional addresses. At the end of the test, the resulting failure list 106 therefore contains an address list of sparse failures and just enough of the addresses of stuck row and stuck column failures to allow repair analysis software to create a repair solution.

In one embodiment, the functionality of the count manager 118 (FIG. 2) is embodied as software performing at least steps 140 through 142 (and may include steps 144, and/or 145 and 146) of the method shown in FIG. 3.

In analyzing the final tag images 112, 114 and failure list 106, any row in the memory device 102 whose corresponding associated failure count 111 in the row tag 112 has expired) must be repaired using one of the available redundant rows. Similarly, all columns in the memory device 102 whose corresponding associated failure count 113 in the column tag 114 has expired must be repaired using one of the available redundant columns.

Any row in the memory device 102 whose corresponding associated failure count 111 in the row tag 112 has remained at the preloaded value contains no defective memory cells 101, and therefore requires no repairs. Similarly, all columns in the memory device 102 whose corresponding associated failure counts 113 in the columns tag 114 whose failure count 113 has remained at the preloaded value (e.g., at the maximum number of available redundant rows) contain no defective memory cells 101, and therefore require no repairs.

Any row in the memory device 102 whose corresponding associated failure count 111 in the row tag 112 is not expired but has not remained at the preloaded value (greater than zero but less than the preloaded failure count value) contains only a sparse number of defective cells and are therefore candidates for repair by available redundant rows remaining after allocation of redundant rows to all designated "must-repair" rows in the memory device 102. Likewise, all columns in the memory device 102 whose corresponding associated failure counts 113 in the row tag 114 is not expired but has not remained at the preloaded value (greater than zero but less than the preloaded failure count value) contain only a few defective cells and are therefore candidates for repair by available redundant columns remaining after allocation of redundant columns to all designated "must-repair" columns in the memory device 102.

It will be appreciated that the final values of each of the failure counts 111 in the row tag 112 and failure counts 113 in the column tag 114 after a test indicates several important pieces of information. First, the value of a given failure count indicates the presence or non-presence of at least one defective memory cell in the corresponding row or column. Second, the value of the failure count indicates whether or not the corresponding row or column in the DUT 102 is designated as a "must-repair" row or column, whether the corresponding row or column in the DUT 102 contains only sparse failures, or whether the corresponding row or column in the DUT 102 contains no failures. Third, the value of a given failure count after a test is complete indicates the number of defective memory cells detected in the corresponding row or column of the DUT 102, up to the maximum allowed number of defective memory cells 101 before the respective row or column is designated as a "must repair" row or column.

In order to optimize the repair solution, all addresses that have address components that are the same as the designated "must-repair" row or column are removed from the failure list 106 since failures that lie in a must-repair row or column will automatically be repaired by a redundant row or column.

Figure 4:
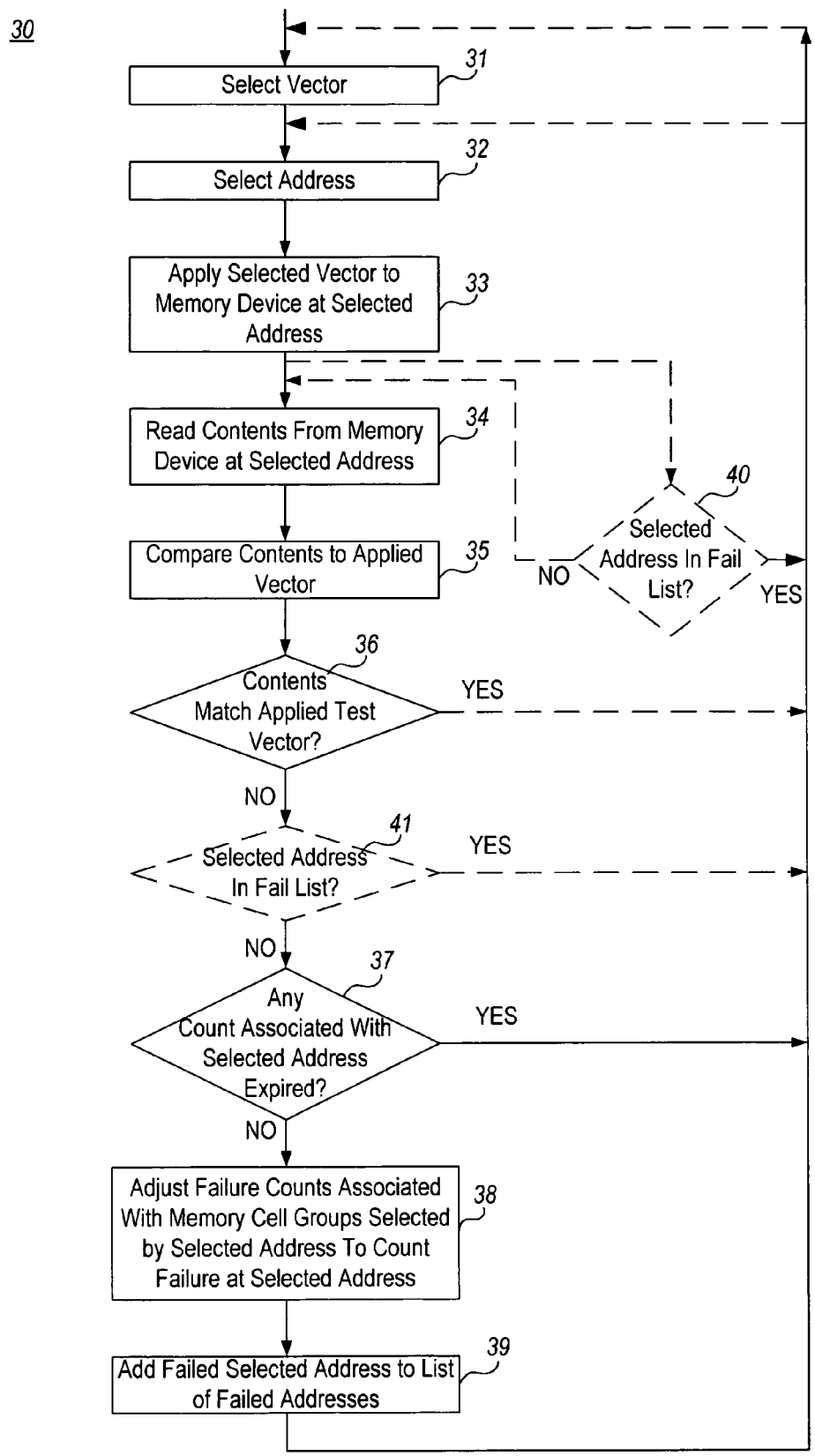
FIG. 4 is a flowchart of an exemplary method for testing a memory device.

FIG. 4 is a flowchart illustrating an embodiment of a method of performing a memory test on a memory device having memory cell groups organized into multiple independently addressable dimensions. As shown, a selected test vector is applied to the memory device at a selected memory device address comprising address components corresponding to each of the plurality of dimensions (steps 31-33). Contents from the memory device at the selected memory device address are read and compared to the applied test vector (steps 34-35). If a mismatch exists between the applied test vector and the contents (determined in step 36), and any of the failure counts associated with a corresponding respective memory cell group in the memory device that are addressed by the selected memory address are expired (determined in step 37), then the method may be repeated with additional selected addresses and/or test vectors. If, however, none of the associated failure counts are expired, then in one embodiment the respective failure counts associated with each of the selected memory cell groups are adjusted to count the mismatch (step 38), and the selected memory address is also preferably added to a list of failed addresses (step 39). The method may be repeated for additional selected addresses, preferably testing every memory cell in the memory device. At the end of testing, the failure list contains a list of addresses comprising addresses of sparse failures and a minimum number of addresses associated with identified must-repair memory cell groups.

In some memory device tests, multiple test vectors may be applied to each address. If a failure is detected on a selected memory device address for a given test vector, then in order to maintain a sparse list of failures, it is important that additional failures on the selected memory device address do not get failure counted when additional test vectors are applied to that address. Accordingly, in one embodiment, the test method includes a step of determining whether a selected memory device address is already present in the fail list (step 40). The presence of an address in the fail list means that the failure that resulted in adding the particular address to the fail list has already been failure counted (i.e., is accounted for in the current failure count values). Therefore, the failure counts associated with that address should not be updated again due to additional failures detected on that address. Accordingly, if the selected memory device address is already present in the fail list (as determined in step 40), then in one embodiment, the selected address is immediately discarded and another memory device address is selected for processing in its place (go to step 32). In another embodiment, the determination as to whether the selected memory device address is already present in the fail list (step 41) is made after a failure has been detected at the selected memory device address (at step 36). In this embodiment, if it is determined (in step 41) that the selected memory device address is already present in the fail list, then the failure counts are not updated and the address is not re-added to the fail list (i.e., steps 38 and 39 are skipped), and processing may continue with another memory device address and/or another test vector.

In one embodiment, the functionality of the count manager 118 (FIG. 2) is embodied as software performing at least steps 37 through 39 of the method shown in FIG. 4.

It will be appreciated that unlike traditional methodologies, the present invention does not require the generation of an error image, thereby eliminating cost and complexity by eliminating a hardware component of the same size (row, column, and depth) as the memory device itself.

While illustrative embodiments have been presented in which the plurality of dimensions include a row dimension and a column dimension, the plurality of dimensions may additionally or alternatively include any of a depth dimension, one or more diagonal dimensions, and/or one or more other memory cell grouping patterns with corresponding address components that access memory cell groups along the associated dimensions.

The embodiments described and illustrated herein may be implemented in software, firmware or hardware, or any suitable combination thereof. The method and apparatus of the invention may be implemented by a computer or microprocessor process in which instructions are executed, the instructions being stored for execution on a computer-readable medium and being executed by any suitable instruction processor. Alternative embodiments are contemplated, however, and are within the spirit and scope of the invention.

What is claimed is:

1. A method for keeping track of failures in a memory device under test, the memory device comprising a plurality of memory cells organized into a plurality of memory cell groups along a plurality of dimensions, each memory cell group addressable by one of a plurality of address components corresponding to one of the plurality of dimensions, the method comprising:

receiving indication of a failed memory address, the failed memory address comprising a plurality of address components corresponding to a plurality of selected memory cell groups addressed by the failed memory address, each of the selected memory cell groups organized along a different associated dimension and each of the selected memory cell groups associated with a corresponding failure count that indicates a number of redundant memory cell groups organized along a dimension other than the dimension of the associated memory cell group that are available for repairing the associated memory cell group;

determining whether any of the failure counts associated with the selected memory cell groups has an expired status indicating that the corresponding selected memory cell group must be repaired using a redundant memory cell group organized along the dimension of the corresponding memory cell group; and if none of the failure counts associated with the selected memory cell groups has an expired status, adjusting the failure counts associated with the selected memory cell groups to reflect detection of a failure at the failed memory address.

2. The method of claim 1, further comprising:

adding the failed memory address to a fail list comprising a list of failed memory addresses detected in the memory device.

3. The method of claim 2, wherein the step of adjusting the failure counts is performed only if the selected memory address is not present in the fail list.

4. The method of claim 1, wherein:

if the step of adjusting the failure counts results in a change of any of the respective failure counts associated with the selected memory cell groups to an expired status, adjusting the respective failure counts associated with memory cell groups whose failure counts track available redundant memory cell groups that are organized along the dimension of the selected memory cell group associated with the change to expired status.

5. A computer readable storage medium tangibly embodying program instructions implementing a method for keeping track of failures in a memory device under test, the memory device comprising a plurality of memory cells organized into a plurality of memory cell groups along a plurality of dimensions, each memory cell group addressable by one of a plurality of address components corresponding to one of the plurality of dimensions, the method comprising:

receiving indication of a failed memory address, the failed memory address comprising a plurality of address components corresponding to a plurality of selected memory cell groups addressed by the failed memory address, each of the selected memory cell groups organized along a different associated dimension and each of the selected memory cell groups associated with a corresponding failure count that indicates a number of redundant memory cell groups organized along a dimension other than the dimension of the associated memory cell group that are available for repairing the associated memory cell group;

determining whether any of the failure counts associated with the selected memory cell groups has an expired status indicating that the corresponding selected memory cell group must be repaired using a redundant memory cell group organized along the dimension of the corresponding memory cell group; and if none of the failure counts associated with the selected memory cell groups has an expired status, adjusting the failure counts associated with the selected memory cell groups to reflect detection of a failure at the failed memory address.

6. The computer readable storage medium of claim 5, the method further comprising:

adding the failed memory address to a fail list comprising a list of failed memory addresses detected in the memory device.

7. The computer readable storage medium of claim 6, wherein the step of adjusting the failure counts is performed only if the selected memory address is not present in the fail list.

8. The computer readable storage medium of claim 5, wherein:
   if the step of adjusting the failure counts results in a change of any of the respective failure counts associated with the selected memory cell groups to an expired status, adjusting the respective failure counts associated with memory cell groups whose failure counts track available redundant memory cell groups that are organized along the dimension of the selected memory cell group associated with the change to expired status.

* * * * *